(12) United States Patent
Leobandung (10) Patent No.: US 9,716,056 B2
(45) Date of Patent: Jul. 25, 2017

(54) INTEGRATED CIRCUIT WITH BACK SIDE INDUCTOR

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/604,787

(22) Filed: Jan. 26, 2015

(65) Prior Publication Data

US 2016/0218168 A1  Jul. 28, 2016

(51) Int. Cl.
*H01L 27/08* (2006.01)
*H01L 23/48* (2006.01)
(Continued)

(52) U.S. Cl.
CPC ........ *H01L 23/481* (2013.01); *H01L 21/6835* (2013.01); *H01L 23/5227* (2013.01); *H01L 28/10* (2013.01); *H01L 23/645* (2013.01); *H01L 24/13* (2013.01); *H01L 24/16* (2013.01); *H01L 2221/6834* (2013.01);
(Continued)

(58) Field of Classification Search
CPC ....... H01L 28/10; H01L 21/82; H01L 23/481; H01L 21/10; H01L 21/6835
See application file for complete search history.

(56) References Cited

U.S. PATENT DOCUMENTS 6,800,930 B2   10/2004   Jackson et al.
7,432,580 B2   10/2008   Sato et al.
(Continued)

FOREIGN PATENT DOCUMENTS

CN   1560933 A      1/2005
JP   2008103397 A   5/2008
(Continued)

OTHER PUBLICATIONS

Chen et al., "Fine-pitch Backside Via-last TSV Process with Optimization on Temporary Glue and Bonding Conditions", 2013 Electronic Components & Technology Conference, © 2013 IEEE, pp. 1811-1814.

*Primary Examiner* — Marc Armand
*Assistant Examiner* — Sarah Salerno
(74) *Attorney, Agent, or Firm* — Steven F. McDaniel (57) ABSTRACT

A method for providing an inductively loaded integrated circuit includes providing a wafer with an integrated circuit formed thereon, the integrated circuit comprising at least one substrate via, including one or more substrate vias that are to be inductively loaded, and fabricating an inductive element on the backside of the wafer that electrically connects to the substrate vias that are to be inductively loaded. A corresponding apparatus includes a wafer with an integrated circuit formed on a top side of the wafer and an inductive element formed on a back side of the wafer, and at least one substrate via that extends through the wafer and electrically connects the inductive element to the integrated circuit. In certain embodiments, the inductive element comprises a plurality of conductive layers. In some embodiments, the inductive element comprises multiple turns on each conductive layer.

6 Claims, 6 Drawing Sheets

(51) Int. Cl.
    *H01L 23/522*      (2006.01)
    *H01L 21/683*      (2006.01)
    *H01L 49/02*      (2006.01)
    *H01L 23/64*      (2006.01)
    *H01L 23/00*      (2006.01)

(52) U.S. Cl.
    CPC .............. *H01L 2221/68327* (2013.01); *H01L 2221/68381* (2013.01); *H01L 2224/131* (2013.01); *H01L 2224/16227* (2013.01); *H01L 2924/14* (2013.01); *H01L 2924/3025* (2013.01)

(56) References Cited

U.S. PATENT DOCUMENTS

| | | | | |
|---|---|---|---|---|
| 7,531,407 | B2 * | 5/2009 | Clevenger | H01L 21/76898 257/E21.022 |
| 8,569,861 | B2 | 10/2013 | O'Donnell et al. | |
| 2007/0040272 | A1 * | 2/2007 | Sheats | H01L 21/4867 257/737 |
| 2010/0109169 | A1 * | 5/2010 | Kolan | H01L 21/486 257/787 |
| 2010/0193905 | A1 | 8/2010 | Kim et al. | |
| 2011/0095395 | A1 * | 4/2011 | Ellul | H01L 21/76898 257/531 |
| 2012/0074588 | A1 * | 3/2012 | Hsiao | H01L 21/568 257/777 |
| 2012/0187530 | A1 * | 7/2012 | Zhang | H01L 23/645 257/531 |
| 2013/0027127 | A1 * | 1/2013 | Topaloglu | H01L 23/66 327/564 |
| 2014/0264733 | A1 * | 9/2014 | Yuan | H01L 28/10 257/531 |

FOREIGN PATENT DOCUMENTS

| | | |
|---|---|---|
| JP | 4858692 B2 | 1/2012 |
| JP | 4972306 B2 | 7/2012 |
| KR | 1020060071346 A | 6/2006 |

* cited by examiner

Fig. 10B

INTEGRATED CIRCUIT WITH BACK SIDE INDUCTOR

BACKGROUND OF THE INVENTION

The present invention relates generally to integrated circuit devices and device fabrication and more particularly to inductively loaded integrated circuits and the fabrication of such circuits.

Inductive elements are often used in off-chip voltage conversion circuits such as buck converters due to current response characteristics. However, on-chip voltage regulator circuits typically do not use inductive elements due to the large areas of integrated circuit real estate that they consume.

SUMMARY

As disclosed herein, a method for providing an inductively loaded integrated circuit includes providing a wafer with an integrated circuit formed thereon, the integrated circuit comprising at least one substrate via, including one or more substrate vias that are to be inductively loaded, and fabricating an inductive element on the backside of the wafer that electrically connects to the substrate vias that are to be inductively loaded. A corresponding apparatus includes a wafer with an integrated circuit formed on a top side of the wafer and an inductive element formed on a back side of the wafer, and at least one substrate via that extends through the wafer and electrically connects the inductive element to the integrated circuit. In certain embodiments, the inductive element comprises a plurality of conductive layers. In some embodiments, the inductive element comprises multiple turns on each conductive layer.

DETAILED DESCRIPTION

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

The embodiments disclosed herein provide inductive elements to an integrated circuit without consuming significant circuit area.

Figure 1:
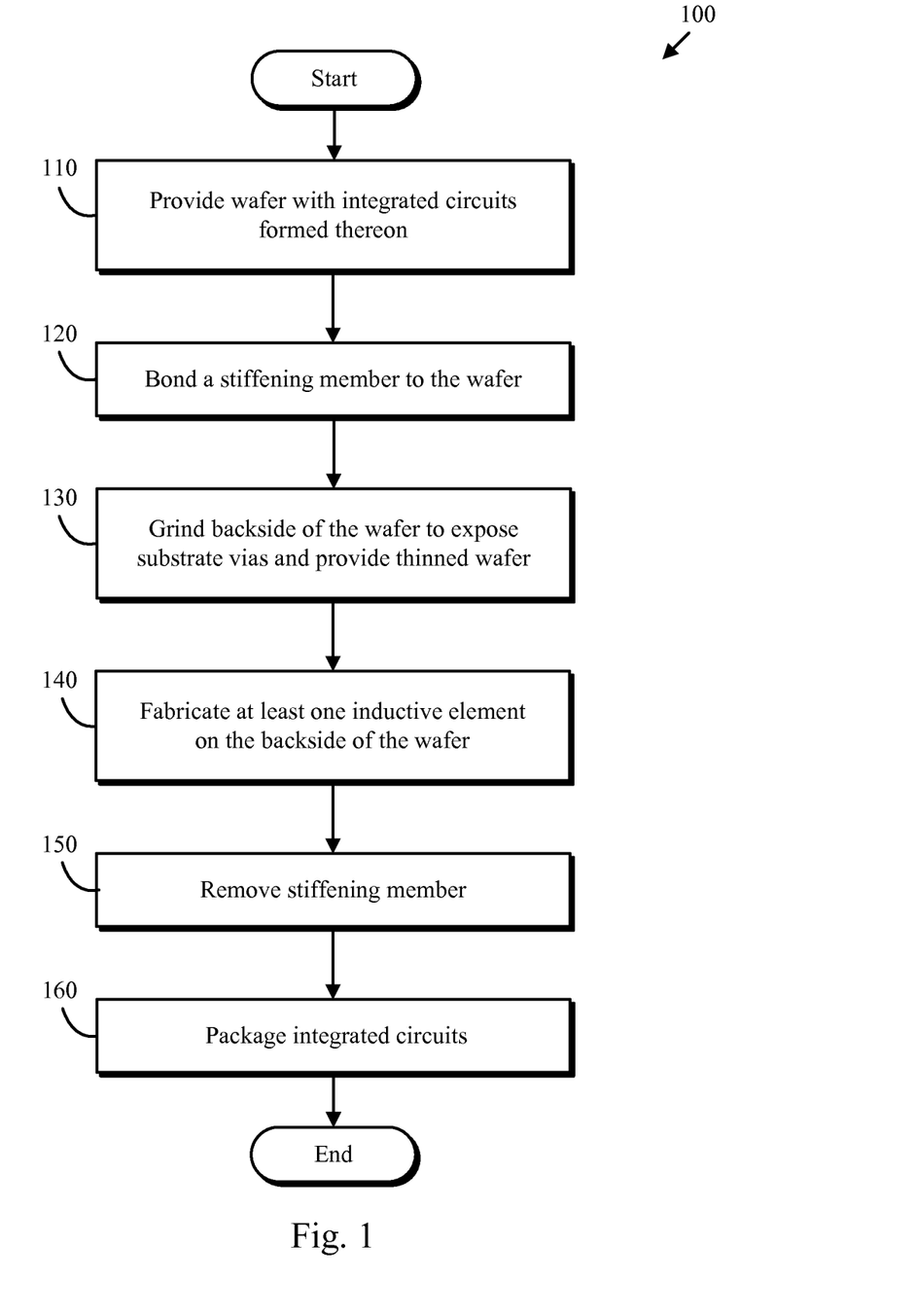
FIG. 1 is a flowchart depicting one embodiment of a method for fabricating an inductively loaded integrated circuit.

For example, FIG. 1 is a flowchart depicting one embodiment of a method 100 for fabricating an inductively loaded integrated circuit. As depicted, the method includes providing (110) a wafer with integrated circuits formed thereon, bonding (120) a stiffening member to the wafer, grinding (130) a backside of the wafer to provide a thinned wafer, fabricating (140) at least one inductive element on the backside of the wafer, removing (150) the stiffening member, and packaging (160) the integrated circuits.

Providing (110) a wafer with integrated circuits formed thereon may include conducting various processes for fabricating integrated circuits on a wafer including forming one or more substrate (i.e., through wafer) vias. Some or all of the substrate vias may be connection elements for circuits that are to be inductively loaded with one or more inductive elements formed on the backside of the wafer. In some embodiments, the substrate vias extend partially through the substrate. In other embodiments, the substrate vias extend completely through the substrate.

Bonding (120) a stiffening member to the wafer may include bonding a stiffening member that has a coefficient of thermal expansion (CTE) that is substantially identical to the CTE of the wafer. In some embodiments, another wafer made of the same material as the original wafer is bonded to the original wafer.

Grinding (130) a backside of the wafer to provide a thinned wafer may be done according to processes known to those of skill in the art. The backside may be ground to achieve a desired thinness for the wafer and/or to expose the substrate vias including those that are to be inductively loaded. In some embodiments, the grinding operation 130 is not necessary and may be omitted.

Fabricating (140) at least one inductive element on the backside of the wafer may include depositing one or more conductive layers onto the backside of the wafer and patterning those layers to form the inductive elements. Insulating layers with connection vias formed therein may be deposited between the conductive layers.

Removing (150) the stiffening member may include dipping the wafer into a solvent or some other process know to those of skill in the art. Packaging (160) the integrated circuits may include dicing the wafers into integrated circuits (i.e., chips) and forming a package around the integrated circuits including any connection elements such as pins and solder balls.

One of skill in the art will appreciate that the method 100 need not be conducted in the precise depicted order, or with all of the depicted operations. For example, the substrate vias may extend through the entire wafer and the bonding operation 120, the grinding operation 130, and the removing operation 150 may be omitted. In another example, the stiffening member is not removed until after the wafer is diced into integrated circuits. Consequently, the packaging operation 160 may overlap with the removing operation 150.

Figure 2:
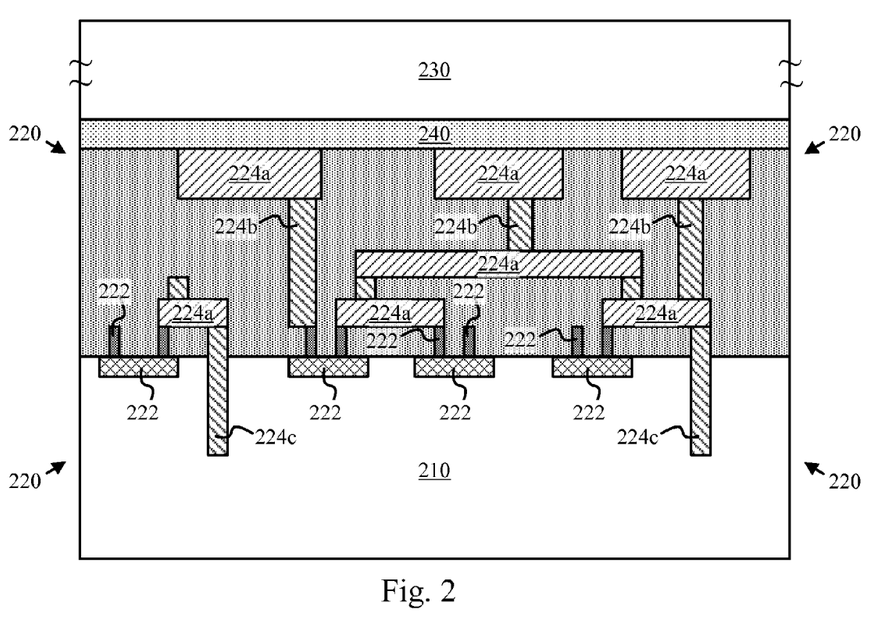
FIGS. 2-5 are cross sectional view illustrations of an inductively loaded integrated circuit at various stages of processing.

FIGS. 2-5 are cross sectional view illustrations of an inductively loaded integrated circuit at various stages of processing. As shown in FIG. 2, a wafer 210 with one or more integrated circuits 220 formed thereon may be bonded to a stiffening member 230 with a bonding material 240. Although a single integrated circuit 220 is shown for simplicity, the wafer 210 may be partitioned into many integrated circuits 220.

The integrated circuit(s) 220 may have various active elements, such as transistors, 222 and interconnection elements 224 including metal lines 224a, vias 224b, and substrate vias 224c. The substrate vias 224c may include one or more substrate vias that connect to portions of the integrated circuit(s) 220 that are to be inductively loaded. In the depicted embodiment, the substrate vias 224c pass partially through the wafer 210. In other embodiments, the substrate vias 224c pass completely through the wafer 210.

Figure 3:
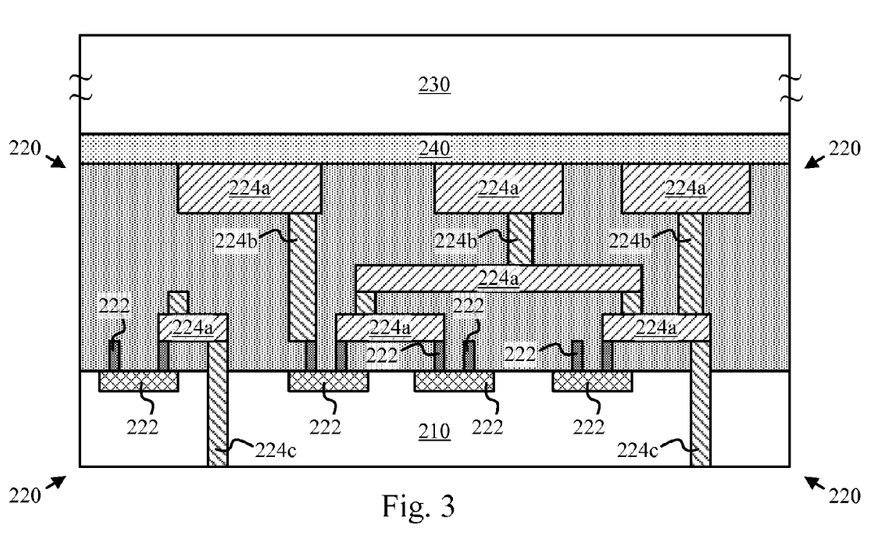

As shown in FIG. 3, the wafer 210 may be ground, or otherwise processed, to thin the wafer and expose the substrate vias 224c.

Figure 4:
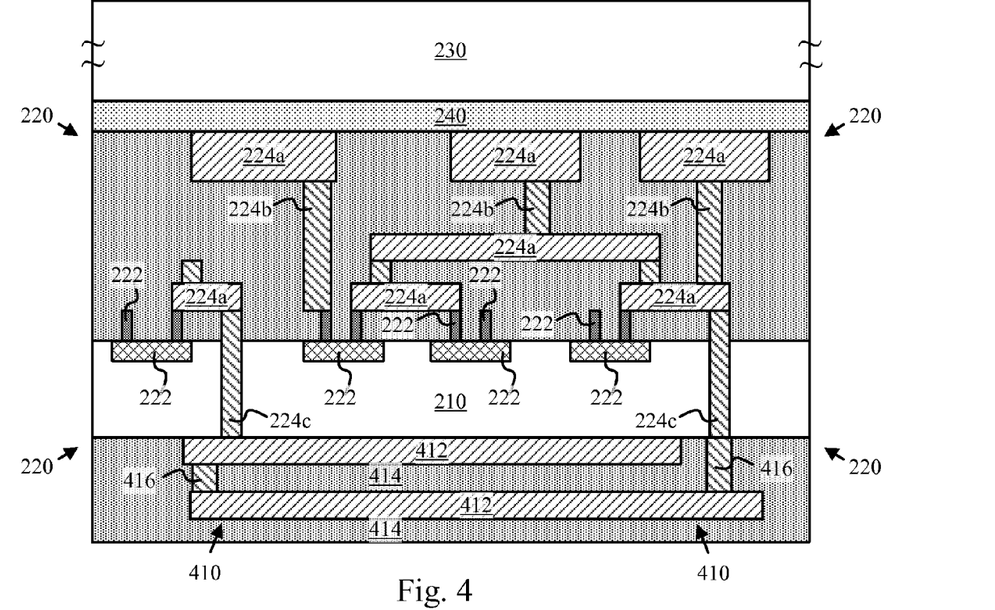

As shown in FIG. 4, one or more inductive elements 410 may be formed on the backside of the wafer 210. The inductive elements 410 may be made of multiple conductive layers 412 that are separated by insulating layers 414. For example, the conductive layers 412 may be formed by depositing and patterning a metal such as copper or aluminum and the insulating layers 414 may be formed by depositing and patterning an electrically insulating material such as silicon dioxide, metal oxide, silicon nitride, and spin on glass.

One or more of the conductive layers 412 may connect to the integrated circuit through the substrate vias 224c. Various backside vias 416 may be used to connect the conductive layers 412 to each other and to the substrate vias 224c. In some embodiments, additional conductive layers 412 are deposited that provide electromagnetic shielding to the integrated circuit(s) 220 and/or the inductive elements 410. For example, additional conductive layers 412 could be disposed above and/or below the inductive elements 410. The additional conductive layers may or may not be patterned.

Figure 5:
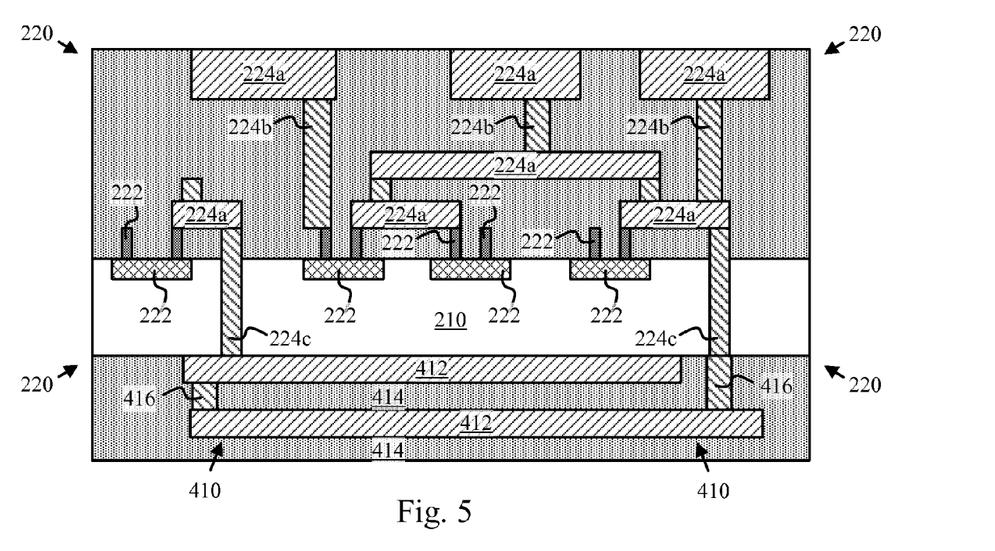

As shown in FIG. 5, the stiffening member 230 may be removed from the wafer 210 and integrated circuit(s) 220. In one embodiment, a solvent (not shown) is used to remove the bonding material 240 and enable separation of the stiffening member 230 from the wafer 210 and integrated circuit(s) 220.

FIGS. 6-10 are bottom view illustrations depicting various examples of layered backside inductive elements 600 in accordance with the present invention. The layered backside inductive elements 600 are specific examples of the inductive elements 410. The inductive elements 600 may be connected to the integrated circuit(s) 220 to provide inductive capabilities to the integrated circuit(s) 220. For example, on-chip voltage converters such as buck converters may be built using the inductive elements 600.

With each illustration, the figure number (i.e., 6 through 10) is appended with the letter A for a first layer, and B for a second layer. The photolithography resolution required to produce the layered backside inductive elements 600 may be significantly less than is required for the integrated circuit(s) 220. For example, the layered backside inductive elements 600 may be patterned using a middle ultra-violet or longer light source.

Figure 6A:
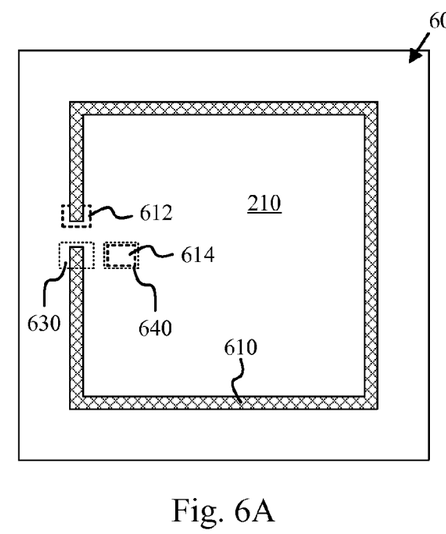
FIGS. 6-10 are bottom view illustrations depicting various examples of layered backside inductive elements in accordance with the present invention. With each illustration, the figure number (i.e., 6 through 10) is appended with the letter A for a first layer, and B for a second layer.
Figure 6B:
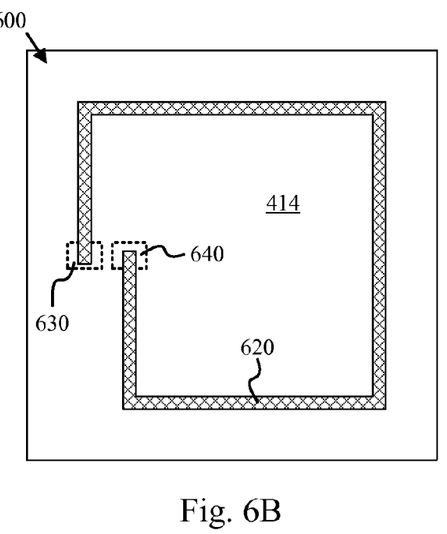
Figure 7A:
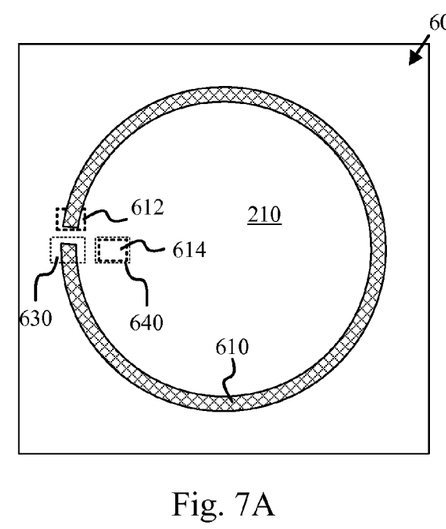
Figure 7B:
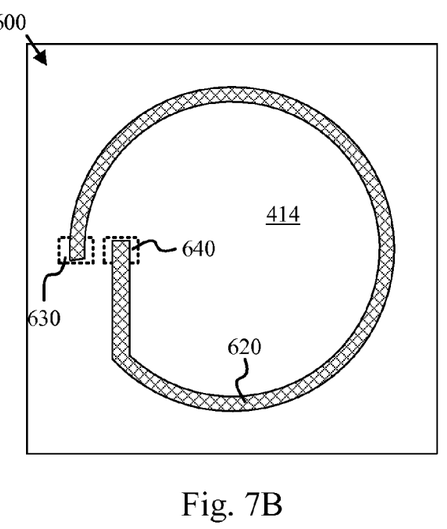

As shown in FIGS. 6A and 6B, as well as FIGS. 7A and 7B, a first conductive layer may be deposited on the backside of the wafer and patterned to provide a first conductive loop 610. The first conductive loop 610 may connect to a first substrate via 612 (which is one of the substrate vias 224c shown in FIGS. 2-5). Subsequently, an insulating layer 414 (not shown in FIGS. 6A and 7A) may be deposited and provided with a backside via 630. In addition, one or more of the substrate vias may be extended by patterning a backside via 640 that lines up with a second substrate via 614 (which is one of the substrate vias 224c shown in FIGS. 2-5). A second conductive layer may also be deposited and patterned to provide a second conductive loop 620.

The second conductive loop 620 may connect to the first conductive loop 610 via the backside via 630 and provide an additional loop to the backside inductive element 600. In a similar manner additional conductive layers and insulating layers may be deposited and patterned to provide additional conductive loops to the backside inductive element 600. The conductive loops may be rectangular as shown in FIGS. 6A and 6B, circular as shown in FIGS. 7A and 7B, or any looping shape that provides an inductive load.

The various conductive loops may be arranged so that the magnetic fields are perpendicular to the substrate and are aligned in the same direction when driven with current. The final conductive loop, which in the depicted embodiments is the second conductive loop 620, may terminate at the backside via 640 which is connected to the second substrate via 614 (which is also one of the substrate vias 224c shown in FIGS. 2-5). Terminating at the backside via 640 and the second substrate via 614 enables the integrated circuit(s) 220 to drive the loops 610, 620 with a current.

In the depicted examples, the first and second conductive loops 610, 620 produce a clockwise current loop when current is sourced on the first substrate via 612 and sinked on the second substrate via 614 (and viewed from the backside of the wafer). Consequently, the magnetic fields produced by the first and second conductive loops will substantially align with each other resulting in an increased inductive load to the first and second substrate vias 612, 614 and the integrated circuit 220. One of skill in the art will appreciate that additional conductive loops may be added to the inductive elements 600 by depositing and patterning additional conductive layers and insulating layers.

Figure 8A:
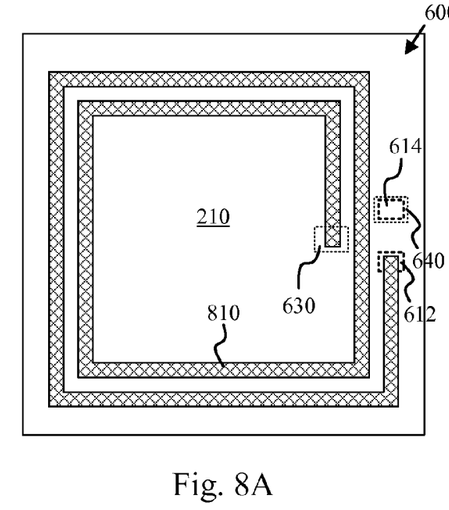
Figure 8B:
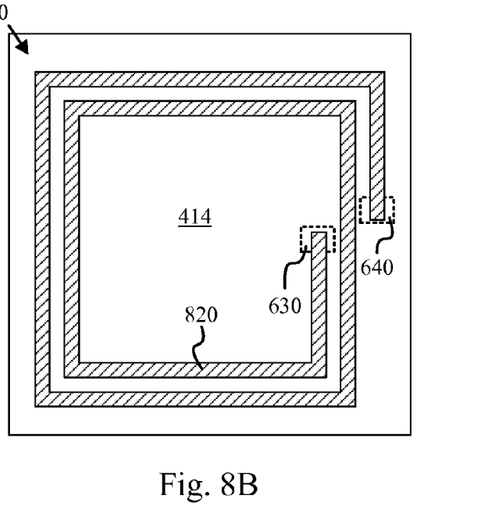
Figure 9A:
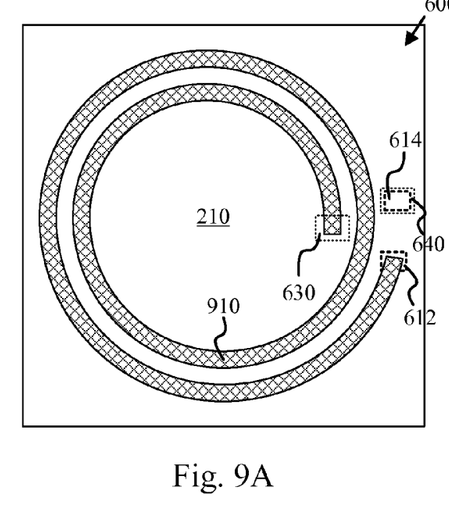
Figure 9B:
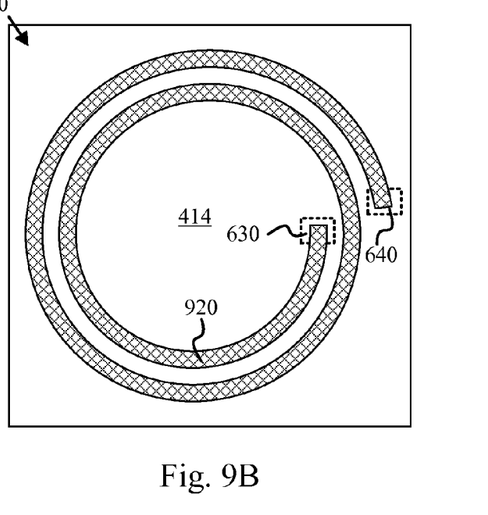

As shown in FIGS. 8A and 8B, as well as FIGS. 9A and 9B, each conductive layer may be patterned with multiple loops. For example, a spiral pattern may be used to provide multiple loops to the inductive elements 600 on each conductive layer. FIGS. 8A and 8B show a rectangular spiraling loops 810 and 820, while FIGS. 9A and 9B show circular spiraling loops 910 and 920. Similar to the loops 610 and 620, the spiraling loops 810 and 820, as well as the spiraling loops 910 and 920, may be separated by an insulating layer 414 (not shown in FIGS. 8A and 9A) with backside vias 630 and 640 formed therein to provide electrical connectivity to the first substrate via 612 and the second substrate via 614.

Figure 10A:
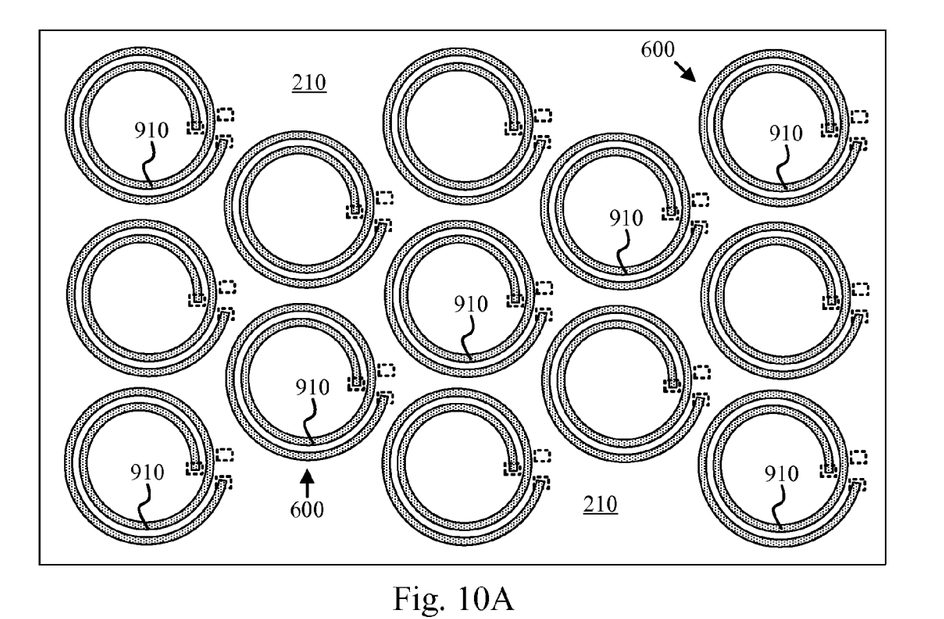
Figure 10B:
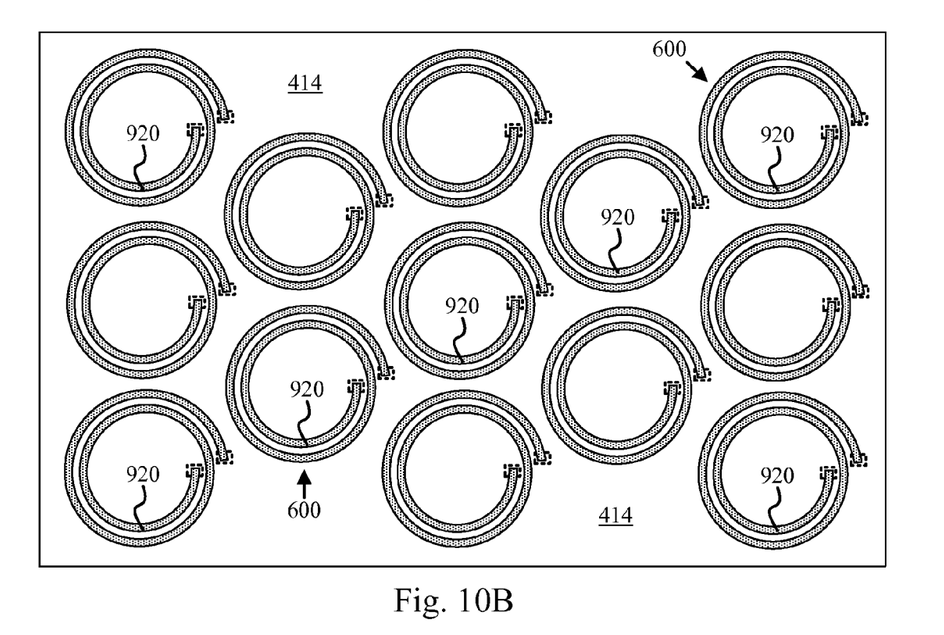

As shown in FIGS. 10A and 10B multiple inductive elements 600 may be formed on the backside of the wafer 210. In the depicted arrangement, the inductive elements 600 comprise circular spiraling loops 910 formed on the wafer 210 and circular spiraling loops 920 formed on the insulating layer 414.

In addition to the steps and operations disclosed herein, additional steps and operations may be performed while retaining the spirit and intent of the disclosed embodiments. Also, it should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for providing an inductively loaded integrated circuit, the method comprising:
    providing a wafer with an integrated circuit formed on a top side of the wafer, the integrated circuit comprising at least one substrate via etched from the top side of the wafer including one or more substrate vias that are to be inductively loaded;
    bonding a stiffening member to the wafer;
    thinning the entire wafer to a selected thickness from the backside of the wafer to expose the at least one substrate via from the back side of the wafer;
    fabricating an inductor comprising multiple turns on a single layer on the backside of the wafer, without any intervening substrates, that electrically connects to the substrate vias that are to be inductively loaded;
    removing the stiffening member from the wafer; and
    dicing the wafer to provide diced integrated circuits.

2. The method of claim 1, wherein fabricating the inductor comprises conducting a lithography process using a middle ultra-violet or longer light source.

3. The method of claim 1, wherein fabricating the inductor comprises forming one or more insulating layers.

4. The method of claim 1, further comprising packaging the diced integrated circuits.

5. The method of claim 1, wherein the stiffening member and the wafer comprise substantially identical materials.

6. The method of claim 1, wherein the inductor is part of a voltage conversion circuit for the integrated circuit.

* * * * *